United States Patent
Voutsas et al.

(10) Patent No.: US 7,018,468 B2
(45) Date of Patent: Mar. 28, 2006

(54) PROCESS FOR LONG CRYSTAL LATERAL GROWTH IN SILICON FILMS BY UV AND IR PULSE SEQUENCING

(75) Inventors: Apostolos T. Voutsas, Vancouver, WA (US); Robert S. Sposili, Portland, OR (US); Mark A. Crowder, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 211 days.

(21) Appl. No.: 10/713,383

(22) Filed: Nov. 13, 2003

(65) Prior Publication Data

US 2005/0103255 A1    May 19, 2005

(51) Int. Cl.
*C30B 1/06* (2006.01)
(52) U.S. Cl. .................. 117/4; 117/8; 117/9; 117/41; 117/42; 117/43
(58) Field of Classification Search .......... 117/4, 117/8, 9, 41, 42, 43
See application file for complete search history.

(56) References Cited

U.S. PATENT DOCUMENTS

| | | | |
|---|---|---|---|
| 6,495,405 B1 | 12/2002 | Voutsas et al. | |
| 6,590,228 B1 | 7/2003 | Voutsas et al. | |
| 6,635,554 B1 * | 10/2003 | Im et al. | 438/482 |
| 6,635,555 B1 | 10/2003 | Voutsas | |
| 6,645,454 B1 | 11/2003 | Voutsas | |
| 2002/0192956 A1 * | 12/2002 | Kizilyalli et al. | 438/689 |
| 2003/0153111 A1 * | 8/2003 | Koyama et al. | 438/30 |

OTHER PUBLICATIONS

Proceeding entitled, "CO2 Laser Crystallization of Silicon on Bulk Fused Silica", by Hawkins et al., published in Material Research Society Symposia Proceedings vol. 4, pp 529-534, 1982.

* cited by examiner

*Primary Examiner*—Robert Kunemund
(74) *Attorney, Agent, or Firm*—Law Office of Gerald Maliszewski; Gerald Maliszewski

(57) ABSTRACT

A process of lateral crystallization is provided for increasing the lateral growth length (LGL). A localized region of the substrate is heated for a short period of time. While the localized region of the substrate is still heated, a silicon film overlying the substrate is irradiated to anneal the silicon film to crystallize a portion of the silicon film in thermal contact with the heated substrate region. A $CO_2$ laser may be used as a heat source to heat the substrate, while a UV laser or a visible spectrum laser is used to irradiate and crystallize the film.

16 Claims, 3 Drawing Sheets

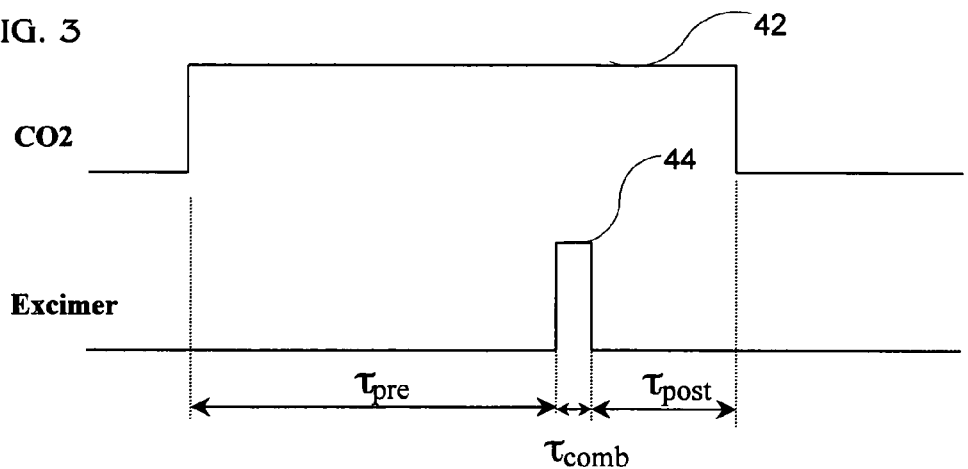
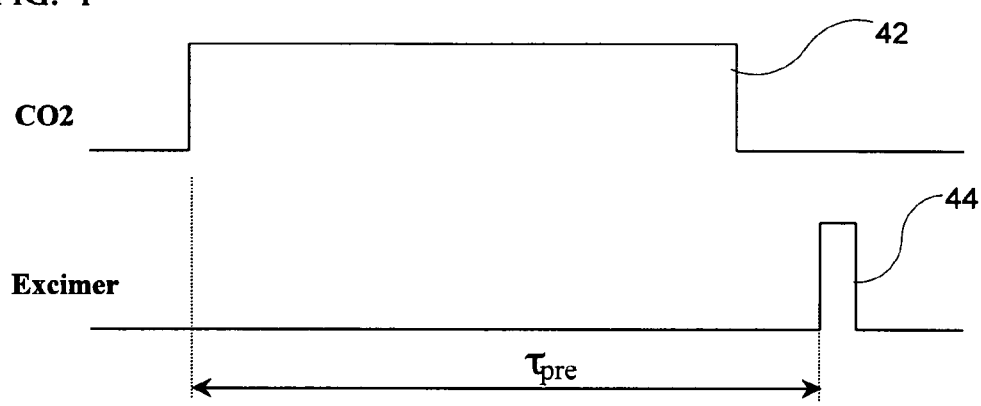
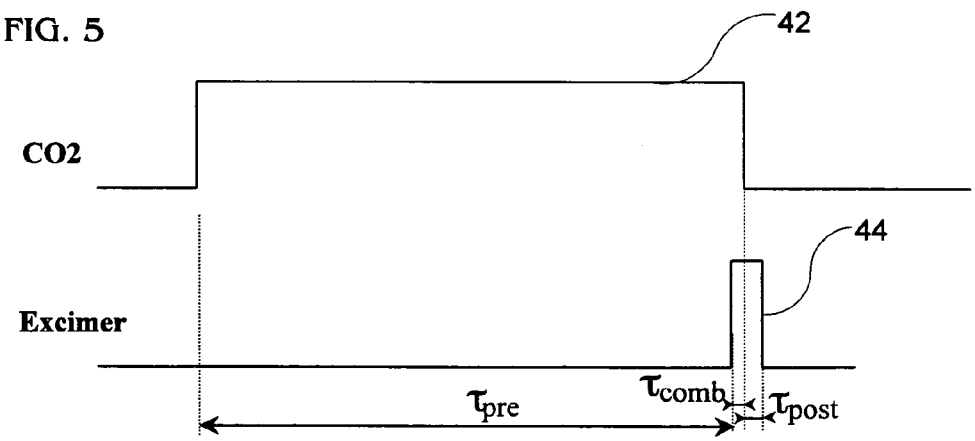

PROCESS FOR LONG CRYSTAL LATERAL GROWTH IN SILICON FILMS BY UV AND IR PULSE SEQUENCING

BACKGROUND OF THE INVENTION

The present invention relates generally to methods of forming polycrystalline thin films and, more particularly, to methods using laser annealing and lateral crystallization.

Polycrystalline silicon thin films are used to form thin-film transistors (TFTs) for pixel-switching elements and other integrated circuits that are simultaneously fabricated on display substrates. These thin films and TFTs can provide for the fabrication of integrated circuits on various substrates, for example, glass, plastic, or metal. These thin films and TFTs may also be used for non-display applications as well. Possible non-display applications include, sensors, ASICS, memory modules, or printer heads, for example.

Polycrystalline silicon, also known as poly-Si, films may be produced by crystallizing amorphous silicon, or microcrystalline silicon. Quality poly-Si films can be produced using lateral growth processes, also referred to as lateral crystallization. Quality poly-Si films can then be used to produce high performance poly-Si TFTs. The quality of the films and the resulting TFTs depends to a great extent on the crystal characteristics. Laser induced lateral crystallization, which uses an excimer laser to crystallize amorphous silicon such that the crystal grows in a lateral direction, has been used to produce quality poly-Si films. By moving the laser and sequentially exposing adjacent regions it is possible to form polycrystalline films having long crystal grains oriented in the scanning direction.

Despite the success of laser-induced lateral crystallization, and related crystallization techniques, in producing quality poly-Si materials problem areas persist. There is a continued lack of uniformity in the material characteristics of the films produced. The lack of uniformity results, in part, from the formation of sub-boundaries along the direction of lateral growth. The sub-boundaries generate trap states within the active layer, which may modulate device operation resulting in non-uniformity in device characteristics, including threshold voltage. Another problem is related to the lateral growth length (LGL), which is the distance that the crystal grows laterally for each laser shot. The LGL is currently limited to between approximately less than 3–5 µm. This LGL limitation also affects techniques that employ sequential crystallization by scanning, because the moving pitch (p) between sequential laser shots is even more restricted in that the moving pitch should be less than the LGL, (p<LGL). Crystallization over lengths of between about 30 µm and 100 µm, which is desired for device fabrication, requires many shots, which translates to longer process times and reduced productivity.

SUMMARY OF THE INVENTION

Accordingly, a process is provided to increase the LGL. The method may also simultaneously increase the spacing between sub-boundaries, thereby reducing the sensitivity of device characteristics to non-uniformity issues caused by sub-boundaries.

The process of lateral crystallization comprises providing a silicon film on a substrate surface. A localized substrate region at the substrate surface is exposed to a laser heating source. The laser heating source may be a $CO_2$ laser for example. A portion of the silicon film in thermal contact with the localized substrate region is crystallized by irradiation from a laser annealing source. The laser annealing source may be a UV laser, such as an excimer laser, or a visible laser, such as a frequency-doubled solid state laser.

BRIEF DESCRIPTION OF THE DRAWINGS

FIG. 3 illustrates a process sequence.
FIG. 4 illustrates a process sequence.
FIG. 5 illustrates a process sequence.

DETAILED DESCRIPTION OF THE INVENTION

A theoretical study of the physics of laser annealing reveals that the lateral growth length (LGL) is related to the time that the molten Si film can remain at, or slightly above, a temperature range that prohibits nucleation from occurring within undercooled, molten silicon. The temperature range below which nucleation occurs may be referred to herein as the nucleation temperature. The temperature of the Si during crystallization depends, in part, on the rate of heat loss from the irradiated domain. The irradiated domain refers to that portion of the silicon film that is irradiated during laser annealing. Slower heat loss will correspond to a longer time period at, or above, the nucleation temperature. The longer the time period that the Si within the irradiated domain is above the nucleation temperature, the longer the resulting lateral growth length will be.

Figure 1:
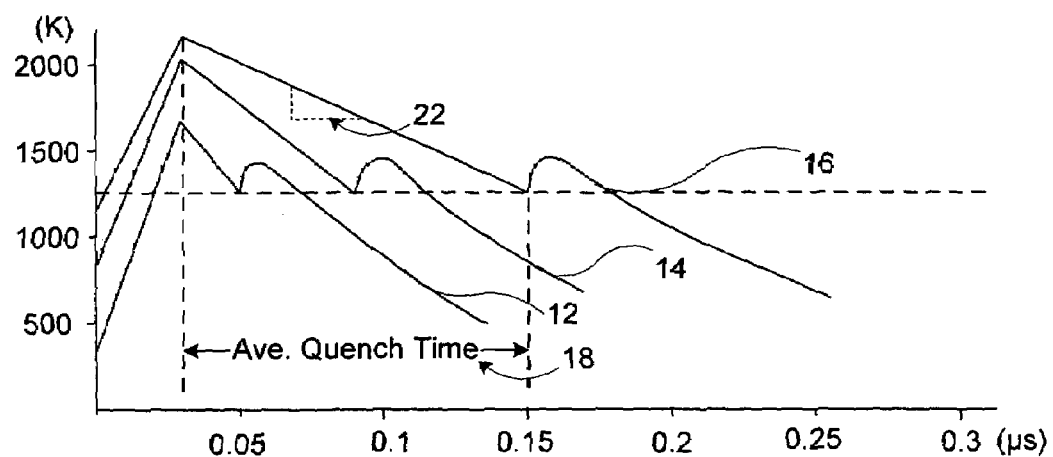
FIG. 1 is a temperature history plot for a silicon film.

Increasing the steady-state temperature of the substrate will reduce the rate of heat loss from the cooling molten-Si film. FIG. 1 illustrates a temperature history of laser-irradiated Si films corresponding to three substrate temperatures. Temperature history refers to a plot of temperature versus time at a specific location within the irradiated domain. FIG. 1 shows plots of the temperature history at the surface of an irradiated domain of Si film. The first temperature history 12 is for a silicon film over a substrate at room temperature, about 300 K. The second temperature history 14 is for a silicon film over a substrate at about 900 K. The third temperature history 16 is for a silicon film over a substrate at about 1200 K. Generally, the three plots show some common patterns for films irradiated by a laser pulse. The laser pulse heats the Si film rapidly increasing its temperature within several nanoseconds, melting the irradiated region of the Si film. The laser pulse may be between 30 and 300 nanoseconds long, and was 30 nanoseconds in the examples shown in FIG. 1. Once the laser pulse ends, the temperature of the molten Si film continues to climb, in response to the energy that has been pumped into the film by the laser pulse until a maximum temperature is reached. The temperature value at the maximum point depends on several factors, including the laser fluence, the substrate temperature, the pulse duration, and the film thickness, along with other factors. Since heat is removed by conduction through the bottom of the irradiated domain, and the surrounding unmelted film, as well as radiation from the top surface, the temperature of the irradiated domain will reach its maximum value and then decline as heat is removed from the irradiated domain. Conduction tends to dominate the heat removal process. As the temperature in the molten Si region falls below the formal melting point of the film, lateral growth occurs in the film. The formal melting point refers to the established melting point of a bulk material, for example bulk silicon. The molten Si that exists at temperatures below its formal melting point is referred to as undercooled liquid. Such liquid can exist at temperatures substantially below the formal melting point. For example, crystalline silicon has a formal melting point of 1410° C., yet undercooled Si can exist at temperatures as low as approximately 900° C. Lateral growth continues as the temperature continues to decline. However, the probability of nucleation is related to the amount of undercooling in the molten-Si. The lower the temperature of an undercooled liquid, the higher the probability of nucleation occurring within the liquid molten-Si. Nucleation disrupts the lateral growth process and thereby limits the lateral growth length. When nucleation occurs, release of latent heat momentarily increases the temperature in the recrystallized Si film, which manifests as a hump on the temperature history. Although the nucleation temperature is not fixed, since nucleation is a stochastic process of temperature and time, it is possible to identify a temperature band within which the probability for nucleation is high enough to interfere with lateral crystallization processes. This band has been empirically determined to be in the range of between approximately 1200 K and 1300 K. The horizontal dashed line in FIG. 1 corresponds approximately to the center of this band. After the molten Si film completely transforms to solid-Si, by pure lateral growth or a combination of lateral growth and nucleation processes, the temperature continues to drop as shown in FIG. 1.

Comparing the three temperature history plots at three different substrate temperatures shows the profound effect that the temperature of the substrate has on the characteristics of the temperature history of the film. Higher substrate temperatures prolong the average quench time, which is the time the molten-Si remains at temperatures above the band corresponding to high nucleation probability. The average quench time 18 for the case of the substrate at approximately 1200 K is shown. The higher substrate temperature also decreases the solidification velocity, which is the velocity of the advancing solid interface. The solidification velocity is given by the slope of the temperature history curve, which is shown at 22 for the case using an approximately 1200 K substrate temperature, and is related to the propensity of the material for defect formation. The higher substrate temperature also increases the sub-boundary spacing. Sub-boundary spacing on the order of 2–5 µm can be obtained as the substrate temperature approaches the Si melting point. In contrast, the sub-boundary spacing is only on the order of 0.2–0.5 µm for substrate temperatures corresponding to room temperature. The longer the film is maintained below the formal melting point, but above the band corresponding to high nucleation probability, the longer the LGL achieved.

Although the benefits of using a high substrate temperature, for example greater than 1200 K, are clear, these temperatures are incompatible with glass substrates commonly used for display substrates. It is impractical to maintain display glass at steady state temperatures that exceed approximately 600° C.

However, if the period of heating is sufficiently short and the heated area sufficiently small, the high temperature will not cause significant damage to the substrate while still providing some of the benefits of higher substrate temperatures. For example, if the glass substrate immediately under the irradiated domain of the Si were heated for a sufficiently short period of time, the benefits of higher substrate temperature can be obtained, without causing significant substrate damage. Significant damage means substrate damage sufficient to prevent further processing, or render the substrate wholly unusable for its intended purpose. A certain amount of degradation of the substrate may therefore be acceptable, even if it may affect performance parameters or production yield.

In one embodiment of the present method, a first laser source is used to irradiate the silicon film, and a second laser source is used to heat the underlying substrate. Since Si absorbs strongly in the UV-visible range, for example below 0.8 µm, the first laser source will preferably emit in this UV-visible range. Excimer lasers are viable candidates for use as the first laser source. $SiO_2$, and glass, such as borosilicate glass, for example CORNING 1737, absorb strongly in the far-IR region, from about 9 to 11 µm. The second laser source preferably emits in this far IR region. $CO_2$ lasers are commercially available at wavelengths of 10.6 µm, which make them suitable candidates for the second laser source.

The primary parameters that control the peak temperature and temperature history of a substrate for a single $CO_2$ laser pulse include, the instantaneous power (energy/time), the instantaneous power density (instantaneous power/area), and the fluence (instantaneous power density times pulse duration, which correponds to energy/area/pulse). In some laser systems the instantaneous power is a fixed parameter. In this case, the instantaneous power density (IPD) can be adjusted by adjusting the beam area. Similarly, the fluence can be adjusted by adjusting the beam area and by controlling the pulse duration. Decreasing the beam area increases both the IPD and the fluence. However, the fluence can be controlled independently from the IPD by adjusting the laser pulse duration.

If multiple laser pulses are being used to heat the substrate, the average power density may also affect the temperature history. The average power density corresponds to the fluence times the repetition rate, which also corresponds to the instantaneous power density times the duty cycle. The duty cycle is the fraction of time that the $CO_2$ laser is actually firing. The average power density can be, controlled by adjusting the beam area, which affects both the fluence and the IPD, by adjusting the pulse width, which affects the fluence, or by adjusting the repetition rate, which affects the duty cycle and the average power density independent of the fluence or the IPD.

In sequential lateral solidification processes, the annealing laser source is moved by a scanning distance, which is some fraction of the lateral growth length (LGL) between annealing exposures. If the substrate is continuously scanned, the annealing laser source may be fired as the desired scanning distance is reached. In an embodiment of the present method, the $CO_2$ laser may be scanned along with the annealing exposure. This results in a given region of the substrate being exposed multiple times as the scan progresses. Accordingly, the cumulative average power density will affect the temperature history of the substrate. The cumulative average power density is the average power density times the number of shots that a given point is exposed to. In an embodiment of the present method, wherein there is one $CO_2$ laser shot per annealing laser shot, the number of shots is defined by the distance across the beam in the scanning direction divided by the step size of the $CO_2$ laser.

In another embodiment, multiple $CO_2$ laser shots will be made between annealing laser shots as the substrate is continuously scanned. In this case, the number of shots is still determined by the distance across the beam in the scanning direction divided by the step size of the $CO_2$ laser.

The $CO_2$ laser may not have the same step size or distance across the beam as the annealing laser.

In another embodiment, the substrate is scanned in discrete steps and multiple $CO_2$ laser shots will be made between annealing laser shots. In this case, the number of shots may be determined by multiplying the number of $CO_2$ laser shots between scanning steps times the distance across the $CO_2$ beam in the scanning direction divided by the $CO_2$ laser step size.

Figure 2:
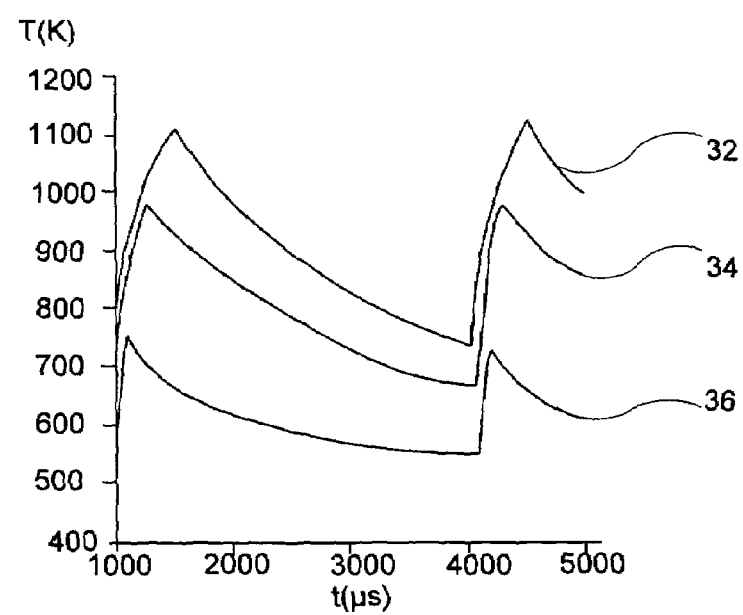
FIG. 2 is a temperature history plot for an $SiO_2$ substrate.

FIG. 2 shows the temperature history for three pulses, using a 1 mm² beam area for these examples. The pulses are characterized by pulse duration and fluence. The first curve 32 corresponds to a 400 μs pulse at 15 mJ/mm². The second curve 34 corresponds to a 400 μs pulse at 10 mJ/mm². The third curve 36 corresponds to a 100 μs pulse at 4 mJ/mm². From these given values for each example pulse, it would be possible to calculate the IPD. For these examples the time between pulses was approximately 3 ms, so the average power density may also be determined. The instantaneous power was not fixed for the purpose of these examples, which illustrate achievable temperatures and the affect of certain control parameters on the temperature histories. The temperature histories shown in FIG. 2 do not take into account substrate scanning.

By reviewing a temperature history, similar to those shown in FIG. 2, it will be possible to approximately select an effective substrate temperature at which the annealing process will occur. According to an embodiment of the present process, the Si film and any supporting layers, including an $SiO_2$ substrate, a glass substrate, or an $SiO_2$ layer overlying a glass substrate, in contact with the Si film, are irradiated by two localized irradiation sources. One source is a UV-visible source suitable for crystallizing the Si film. The other source is suitable for heating the $SiO_2$ substrate. The two sources have a temporal offset, which may be used to select the effective substrate temperature for the irradiated domain for a known peak temperature and temperature history.

In one embodiment, for example, a $CO_2$ laser is used as a laser heating source to heat the $SiO_2$ layer under the Si film. The Si film is irradiated using either a UV laser, such as an excimer laser or frequency-tripled solid-state laser, or a visible laser, such as a frequency-doubled solid-state laser, as a laser annealing source. A XeCl laser at 308 nm or a KrF laser at 243 nm are possible candidates for the excimer laser. Frequency-tripled solid-state lasers, such as tripled Nd-YAG lasers or tripled Nd-YVO₄ lasers, are also possible candidates for the UV laser Frequency-doubled solid-state lasers, such as doubled Nd-YAG lasers operating at 532 nm or doubled Nd-YVO₄ lasers, are possible candidates for the visible laser.

FIG. 3 schematically illustrates one embodiment of the present process. Two idealized laser pulses are shown. The $CO_2$ laser pulse 42 starts and heats the $SiO_2$ substrate. Some time later the excimer laser pulse 44 irradiates the Si layer to crystallize it. The time between the start of the $CO_2$ laser pulse and the start of the excimer. laser pulse, also known as the temporal offset ($\tau_{pre}$), can be used to establish the effective substrate temperature at the time of the excimer laser pulse for a given temperature history. In this example, both the $CO_2$ laser pulse and the excimer laser pulse are irradiating the same area at the same time for a period of combined irradiation, $\tau_{comb}$. During $\tau_{comb}$, it is possible for the molten-Si film to absorb energy from both the excimer laser and the $CO_2$ laser. This is because although solid Si is practically transparent to IR radiation, molten-Si absorbs IR radiation. The total fluence of the two beams may need to be adjusted to avoid agglomeration of the Si film. The $CO_2$ laser pulse may remain on for a period, $\tau_{post}$, after the excimer pulse has ended. Some absorption from the $CO_2$ laser pulse may continue to occur within the molten-Si film. This absorption, along with the elevated substrate temperature reduces the quenching rate in the Si film and increases the effective time period for lateral growth, thereby increasing the maximum possible lateral growth length.

FIG. 4 schematically illustrates another embodiment of the present process. Two idealized laser pulses are shown. The $CO_2$ laser pulse 42 starts and heats the $SiO_2$ substrate. Some time after the $CO_2$ laser pulse ends the excimer laser pulse 44 irradiates the Si layer to crystallize it. The time between the start of the $CO_2$ laser pulse and the start of the excimer laser pulse, also known as the temporal offset ($\tau_{pre}$), can be used to establish the effective substrate temperature at the time of the excimer laser pulse for a given temperature history of the substrate based on the $CO_2$ laser parameters. Since there is no overlap between the two laser pulses, the Si film will absorb radiation from the excimer laser pulse separately from the $CO_2$ laser. The Si film will be effectively transparent to the $CO_2$ laser pulse and so will not absorb a significant amount of the $CO_2$ laser pulse. This scheme decouples the effect of the two different sources, while still providing an effective substrate temperature that will prolong the quenching time. Assuming that the fastest of the two lasers discharges at a frequency (f), the temporal offset ($\tau_{pre}$) between the two pulses will be loosely constrained by the following relations: $\tau_{CO2} \leq \tau_{pre} < 1/f - \tau_{fast}$, where $\tau_{fast}$ is the duration of the fast discharge.

FIG. 5 schematically illustrates another embodiment of the present process. Two idealized laser pulses are shown. The $CO_2$ laser pulse 42 starts and heats the $SiO_2$ substrate. Some time before the $CO_2$ laser pulse ends the excimer laser pulse 44 irradiates the Si layer to crystallize it. The time between the start of the $CO_2$ laser pulse and the start of the excimer laser pulse, also known as the temporal offset ($\tau_{pre}$), can be used to establish the effective substrate temperature at the time of the excimer laser pulse by referring to the temperature history of the substrate related to the laser pulse. The excimer laser pulse 44 continues beyond the end of the $CO_2$ laser pulse. In this example, both the $CO_2$ laser pulse and the excimer laser pulse are irradiating the same area at the same time for a period of combined irradiation, $\tau_{comb}$. During $\tau_{comb}$, it is possible for the molten-Si film to absorb energy from both the excimer laser and the $CO_2$ laser. This is because although solid Si is practically transparent to IR radiation, molten-Si absorbs IR radiation. The total fluence of the two beams may need to be adjusted to avoid agglomeration of the Si film. The excimer laser pulse may remain on for a period, $\tau_{post}$, after the $CO_2$ laser pulse has ended.

The excimer laser pulse will temporally correspond approximately to the maximum effective substrate temperature if the excimer laser pulse is timed to coincide with the end of the $CO_2$ laser pulse as shown in FIG. 5, or after the end of the $CO_2$ laser pulse while the temperature of the substrate and film continues to increase after the end of the $CO_2$ laser pulse. In an embodiment of the present method, the temporal offset is determined so that the excimer laser pulse corresponds to approximately the maximum effective substrate temperature, and the maximum effective substrate temperature is controlled by adjusting the energy introduced into the substrate, which determines the temperature history. As discussed above, the energy introduced into the substrate by the $CO_2$ laser can be controlled by adjusting a number of factors. The instantaneous power could be adjusted in some embodiments. The beam area could be adjusted to increase or decrease the IPD and the fluence. The pulse duration could be used to vary the fluence separately from the IPD. The repetition rate, or the corresponding duty cycle, could be adjusted to control the average power density for multiple laser pulses, independent from the factors related to each individual pulse. And in the case of scanning applications the cumulative average power density of multiple scanned shots may be futher adjusted by varying the stepping distance relative to the beam dimension in the scanning direction.

Since the $CO_2$ laser pulse may be heating a localized region of the substrate to a temperature above its formal melting point, it is preferred to provide a spatial alignment of the laser annealing source and the $CO_2$ laser pulse to maximize the overlap of the two sources. In this manner the maximum thermal energy of the $CO_2$ laser pulse may be used so as to provide the desired benefit without introducing additional unused heat to the substrate. The formal melting point refers to the steady state melting point of bulk material, which as discussed herein may be exceeded in a localized area for a short period of time without causing significant damage to the substrate.

With any of these pulse sequences, the rate of temperature change in the substrate is sufficiently slow relative to the annealing source that the substrate has a substantially constant substrate temperature over the approximately 30 ns–300 ns pulse duration of the annealing source plus the subsequent approximately 200 ns–500 ns for resolidification. This is apparent by reviewing the difference in the time scale between FIG. 1 and FIG. 2. Accordingly, it is possible to establish the effective substrate temperature using a given laser pulse from the laser heating source, for example the $CO_2$ laser, by determining the temporal offset ($\tau_{pre}$), corresponding to the desired substrate temperature based upon the temperature history of the substrate surface. Similarly, for a given temporal offset the $CO_2$ laser pulse sequence may be adjusted to achieve the desired substrate temperature at the time of the annealing laser pulse.

A range of values may be suitable for practicing one or more embodiments of the present method. The $CO_2$ pulse area is preferably matched to the excimer beam area, although larger or smaller beams may be used. $CO_2$ pulse instantaneous power may be selected so as to provide a desired instantaneous power density based on the beam area used. The following ranges of values may be used as general guidelines:

$CO_2$ pulse duration: 5–1000 μs, preferably 5–100 μsec, or 5–30 μsec.

$CO_2$ pulse area: 1 mm$^2$–1 cm$^2$ $CO_2$ pulse instantaneous power density: 50–150 W/mm$^2$ $CO_2$ pulse fluence: 0.4–4 J/cm$^2$; more preferably 0.4–1.5 J/cm$^2$; even more preferably 0.4–1 J/cm$^2$.

Excimer pulse duration: 30–300 ns

Pulse frequency (f): 100–300 Hz.

Temporal offset ($\tau_{pre}$): 5–1500 μs

Figure 6:
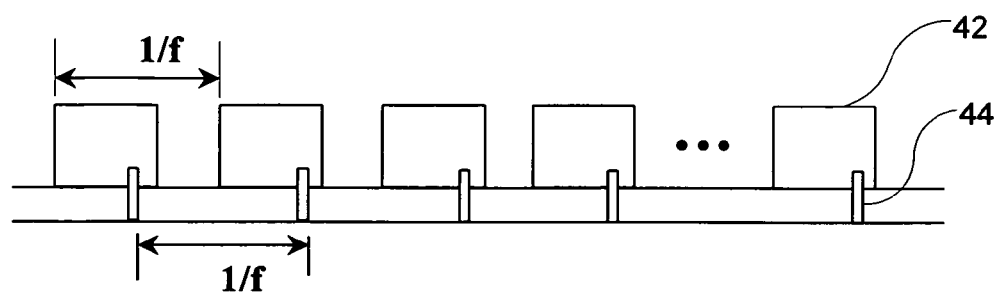
FIG. 6 illustrates a repeating process sequence.

FIG. 6 shows a repeating pulse sequence corresponding to that shown in FIG. 3 for purposes of a scanning crystallization process. The sequences shown in FIGS. 4 and 5 could be similarly repeated for use in scanning crystallization processes.

Lateral growth in Si films using an example of the present process has been found to be substantially longer than without the laser heating source. For example, using a $CO_2$ laser with a pulse duration of 70 μs and a fluence of 0.5–2 J/cm2 and an excimer laser pulse with a temporal offset of approximately 60 to 70 μs, a lateral growth length of 20 to 25 μm can be obtained. The same excimer laser pulse without the use of the $CO_2$ laser, and a substrate at room temperature, produced a lateral growth length of approximately 2 μm. For 50 nm-thick Si films, a sub-boundary spacing of 2 μm has been observed, which is a factor of eight improvement over that obtained without the use of a laser heating source.

Figure 7:
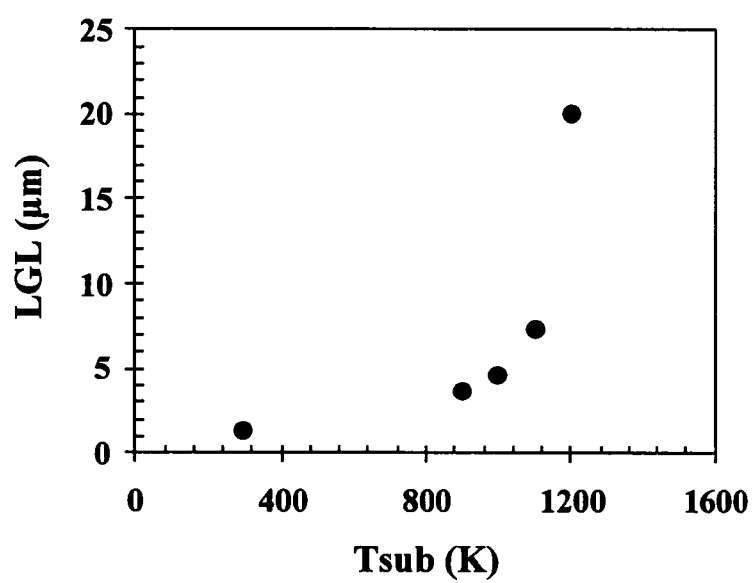
FIG. 7 is a chart of lateral growth length versus substrate temperature.

FIG. 7 is a graph showing the computed dependence of lateral growth length as a function of effective substrate temperature, using an XeCl excimer laser at 308 nm with a 500 mJ/cm$^2$ laser fluence as the laser annealing source, and assuming a single isolated laser heating pulse. Obtaining long lateral growth lengths is a matter of balancing the effective substrate temperature against the potential damage to the substrate as a result of extended exposure to extreme temperatures, even for short periods of time within localized regions.

Several embodiments of the present process have been described. Since modification of these processes will be apparent to those of ordinary skill in the art, the following claims shall not be limited to any specific embodiment.

What is claimed is:

1. A process of lateral crystallization comprising:
   providing a silicon film on a substrate surface;
   heating a localized substrate region at the substrate surface to a temperature above the formal melting point of the substrate for a short period of time such that the substrate is not significantly damaged; and
   irradiating a portion of the silicon film in thermal contact with the substrate region to crystallize the portion of the silicon film, while the localized substrate region remains above the formal melting point of the substrate.

2. The process of claim 1, wherein the substrate surface is $SiO_2$, and heating the localized substrate region includes heating with a laser heating source having an optical wavelength of between approximately 9 and 11 μm.

3. The process of claim 2, wherein the laser heating source is a $CO_2$ laser.

4. The process of claim 3, wherein the $CO_2$ laser has a pulse duration of between approximately 0.01 milliseconds and 1 millisecond.

5. The process of claim 1, wherein irradiating to crystallize the portion of the silicon film includes irradiating with an excimer laser.

6. The process of claim 5, wherein the excimer laser is a XeCl laser or a KrF laser.

7. The process of claim 5, wherein the excimer laser has a pulse duration of between approximately 30 nanoseconds and 300 nanoseconds.

8. The process of claim 1, wherein irradiating to crystallize the portion of the silicon film includes irradiating with a solid-state laser.

9. The process of claim 8, wherein the solid-state laser is a frequency-doubled Nd—YAG laser or a frequency-doubled Nd—YVO$_4$ laser.

10. The process of claim 8, wherein the solid state-laser is a frequency-tripled Nd—YAG laser or a frequency-tripled Nd—YVO$_4$ laser.

11. The process of claim 1, wherein irradiating to crystallize the portion of the silicon film includes irradiating with a laser annealing source that has a discharge frequency of between approximately 100 Hz and 500 Hz.

12. The process of claim 1, wherein irradiating to crystallize the portion of the silicon film, includes irradiating with a laser annealing source that has a discharge frequency of between approximately 10 kHz and 100 kHz.

13. The process of claim 1, wherein heating the localized substrate region includes heating with a laser heating source that is pulsed, wherein irradiating to crystallize the portion of the silicon film includes irradiating with a laser annealing source that is pulsed, and the laser heating source irradiates the substrate prior to irradiation of the silicon film by the laser annealing source pulse.

14. The process of claim 13, wherein the laser annealing source pulse is shorter than the laser heating source pulse, and starts during the laser heating source pulse.

15. The process of claim 14, wherein the laser annealing source pulse is completed during the laser heating source pulse.

16. The process of claim 13, wherein the laser annealing source pulse occurs after the laser heating source pulse.

* * * * *